(12) United States Patent
Verstoep et al.

(10) Patent No.: US 12,721,096 B2
(45) Date of Patent: Aug. 25, 2026

(54) PICK-AND-PLACE APPARATUS AND METHOD

(71) Applicant: NEXPERIA B.V., Nijmegen (NL)

(72) Inventors: Steven Verstoep, Nijmegen (NL); Niels de Koning, Nijmegen (NL); Tim Ellenbroek, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 359 days.

(21) Appl. No.: 18/356,865

(22) Filed: Jul. 21, 2023

(65) Prior Publication Data

US 2024/0038572 A1 Feb. 1, 2024

(30) Foreign Application Priority Data

Jul. 22, 2022 (EP) .................................... 22186488

(51) Int. Cl.

| | |
|---|---|
| ***H10P 72/30*** | (2026.01) |
| ***B65G 47/91*** | (2006.01) |
| ***H10P 72/00*** | (2026.01) |
| ***H10P 72/76*** | (2026.01) |
| ***H10P 72/78*** | (2026.01) |
| ***H10W 90/00*** | (2026.01) |

(52) U.S. Cl.

CPC ........ *H10P 72/3216* (2026.01); *B65G 47/917* (2013.01); *H10P 72/0442* (2026.01); *H10P 72/7604* (2026.01); *H10P 72/78* (2026.01); *H10W 90/00* (2026.01)

(58) Field of Classification Search

CPC ............ B65G 47/917; H01L 21/67132; H01L 21/67727; H01L 21/6838; H01L 21/68714; H01L 25/0753; H05K 13/0409; H05K 13/083; H05K 13/085; H05K 13/0882; H05K 13/089

See application file for complete search history.

(56) References Cited

U.S. PATENT DOCUMENTS

| | | | | |
|---|---|---|---|---|
| 5,680,699 | A | 10/1997 | Vos | |
| 6,842,974 | B1 | 1/2005 | Maenishi | |
| 7,603,193 | B2 | 10/2009 | Maenishi | |
| 10,998,804 | B2 * | 5/2021 | Stokkermans | H01L 21/67144 |
| 2016/0336207 | A1 * | 11/2016 | Stokkermans | H01L 21/67144 |
| 2017/0283256 | A1 | 10/2017 | Lee et al. | |
| 2019/0189478 | A1 * | 6/2019 | Huybers | H01L 21/67144 |
| 2020/0144218 | A1 * | 5/2020 | Wang | H01L 21/67144 |
| 2022/0102189 | A1 * | 3/2022 | Chew | H01L 21/67144 |
| 2022/0277980 | A1 * | 9/2022 | Han | H01L 21/6838 |
| 2023/0164968 | A1 * | 5/2023 | Funke | H05K 13/0084 156/384 |

FOREIGN PATENT DOCUMENTS

| | | | |
|---|---|---|---|
| JP | 2016162955 | A | 9/2016 |
| JP | 6747083 | B2 * | 8/2020 |
| WO | 2019163108 | A1 | 8/2019 |

* cited by examiner

*Primary Examiner* — Saul Rodriguez
*Assistant Examiner* — Brendan P Tighe
(74) *Attorney, Agent, or Firm* — Ruggiero McAllister & McMahon LLC

(57) ABSTRACT

Aspects of the present disclosure relate to a pick-and-place apparatus that is configured to cause components to be placed on a substrate in a number of passes, and during each pass, components among a plurality of components are placed on the substrate in a respective placement pattern among a collection of interleaved placement patterns.

15 Claims, 5 Drawing Sheets

PICK-AND-PLACE APPARATUS AND METHOD

CROSS-REFERENCE TO RELATED APPLICATIONS

This application claims the benefit under 35 U.S.C. § 119(a) of European Application No. 22186488.7 filed Jul. 22, 2022, the contents of which are incorporated by reference herein in their entirety.

BACKGROUND

1. Field of the Disclosure

Aspects of the present disclosure relate to a pick-and-place apparatus. Aspects of the present disclosure further relate to a method for collecting components from a carrier that is arranged on a source supporting unit and for placing the collected components on a substrate that is arranged on a target supporting unit.

2. Description of the Related Art

Light-emitting diodes, LEDs, can be placed on a substrate to form a display panel. An example of such panel is a panel in which the LEDs can be individually controlled for generating a pattern or an image. Typically, for manufacturing such a display panel, light-emitting diodes in the form of packaged or bare semiconductor dies are collected from a carrier that provides and/or supports the packaged or bare semiconductor dies. The carrier can have the form of a film or foil, such as a dicing foil.

Light-emitting diodes can be characterized by the wavelength or color, and intensity of the emitted light. Typically, these parameters show a non-uniform distribution over the wafer. For example, the wafer may have 'best' areas holding semiconductor dies that display a particular desired performance and 'worst' areas holding semiconductor dies that display a performance that is different from the desired performance. These latter areas can typically be found around the edge of the wafer.

The process of collecting LEDs from the carrier and placing the collected LEDs on a substrate is known as a pick-and-place process and the apparatus used for performing this process is referred to as a pick-and-place apparatus.

Known pick-and-place apparatuses comprise a source supporting unit, such as a moveable source table, configured to hold a carrier that is provided with and/or supports a plurality of components such as the abovementioned LEDs. These apparatuses further comprise a target supporting unit, such as a moveable target table, configured to hold a substrate, a first drive unit for driving the source supporting unit, a second drive unit for driving the target supporting unit, and a transport unit for collecting a component from the carrier and for placing the collected component on the substrate. These apparatuses also comprise a controller for controlling the first and second drive units, and the transport unit.

In high-throughput pick-and-place apparatuses, the transport unit is often configured to collect each component from the carrier at a same collect position in space, and the controller is configured to, for the purpose of collecting the components from the carrier, control the first drive unit for moving the source supporting unit relative to said collect position in space. Furthermore, the transport unit is often configured to release each collected component on the substrate at a same release position in space, and the controller is configured to, for the purpose of releasing the components on the substrate, control the second drive unit for moving the moveable substrate table relative to said release position in space.

A schematic illustration of a known pick-and-place apparatus 100 is shown in FIG. 1. Here, the source supporting unit and target supporting unit are referred to using reference signs 101 and 102, respectively. Cameras are identified with reference sign 120. For illustrative purposes, source supporting unit 101 is shown supporting a carrier 101A that holds a single component 107, and target supporting unit 102 is shown supporting a substrate 102A holding a single component 107. Furthermore, source supporting unit 101 and target supporting unit 102 can be actuated using a first drive unit 108 and a second drive unit 109, respectively.

Transport unit 103 comprises two cylinders or drums 104, 105 on which vacuum units 106 are mounted that are each configured for holding a component 107 by means of vacuum. By rotating drum 105, an empty vacuum unit 106 can positioned at or near a collect position C in the vicinity of carrier 101A holding a component 107. For example, a diced semiconductor wafer can be arranged on a dicing foil, and this combination can be arranged on source supporting unit 101.

By applying the vacuum, a component 107 can be collected from carrier 101A. By subsequently rotating drum 105, collected component 107 can be brought into the vicinity of a vacuum unit 106 of drum 104. Here, a hand-over may occur between drum 105 and drum 104. This can for example be achieved by switching off the vacuum for the vacuum unit 106 of drum 105 and by switching on or maintaining the vacuum for the vacuum unit 106 of drum 104. The hand-over between drum 105 and drum 104 allows component 107 to be flipped.

For arranging the component on substrate 102A, drum 104 is rotated until it reaches or comes close to a predefined release position R. At this position, the vacuum can be switched off allowing component 107 to fall at a desired position on substrate 102A.

In this example, drum 104 and drum 105 are rotationally mounted. The required movement for collecting all the semiconductor dies from the semiconductor wafer is achieved using source supporting unit 101, which is typically configured to move in two orthogonal directions in a plane that is parallel to the semiconductor wafer. On the other hand, the required movement for placing all the semiconductor dies on substrate 102A is achieved using target supporting unit 102, which is typically configured to move in two orthogonal directions in a plane that is parallel to substrate 102A. Furthermore, collect position C and release position R are typically fixed in space.

In the known pick-and-place process, a serpentine process is used for collecting the components from the carrier. In a serpentine process, the source supporting unit is moved relative to transport unit such that the order in which the components are collected corresponds to a serpentine shape on the carrier. For example, the source supporting unit first makes a right-to-left motion to allow the components in a same row to be collected, and then makes a shift up or down to move to a next row of components. This row is then collected by making a left-to-right motion, after which another shift is performed to move to the next row allowing the process described above to be repeated.

An advantage of the serpentine process is that this process offers a very high throughput. This is related to the minimal movements of the source supporting unit, which is generally a relatively heavy component. A drawback of the serpentine process is related to the fact that the non-uniformity in device performance of the components on the carrier is transferred to the substrate.

Typically, the performance of the components is determined after manufacturing. For example, the color and/or intensity of each LED on a diced semiconductor wafer can be determined and/or measured. This results in a so-called wafer map that describes one or more parameters of the semiconductor dies as a function of the position of these semiconductor dies on the wafer.

A known example to address the uniformity problem of components on the substrate is to use a robotic arm to pick-and-place the components. Using such arm, and based on the wafer map, a somewhat random distribution of components on the substrate can be realized. However, using a robotic arm does not allow for high throughputs.

JP 2016162955A discloses a pick-and-place apparatus. Further apparatuses are known from US 2017/283256A1 and WO 2019/163108A1.

SUMMARY

Aspects of the present disclosure relate to a pick-and-place apparatus by which improved uniformity of performance can be achieved on the substrate while still allowing high throughput operation.

To this end, a pick-and-place apparatus is provided of the type described above wherein the controller is configured to cause the components to be placed on the substrate in a number of passes, wherein during each pass components among the plurality of components are placed on the substrate in a respective placement pattern among a collection of interleaved placement patterns.

According to aspects of the present disclosure, the components are placed in a plurality of passes. For example, a substrate may require n components to be placed. Instead of arranging the n components in a single process in which the target supporting unit moves from a start position to an end position, m passes are used in which n/m components are placed during each pass. For each pass, the target supporting unit starts and ends at generally the same position, albeit using a pass-specific offset.

During each pass, the components are arranged using a particular placement pattern. A placement pattern corresponds to the pattern of the components on the substrate that are placed in a given pass. According to the present disclosure, the n components are placed using m distinct placement patterns with m>1. The m placement patterns form a collection of interleaved placement patterns. A placement pattern generally comprises empty positions and positions corresponding to components that need to be placed.

Within the context of the present disclosure, an interleaved collection of placement patterns should be construed as a collection of placement patterns, wherein most of the components corresponding to one placement pattern are arranged amidst components corresponding to other placement patterns. In this manner, components that belong to a particular region of the carrier are spread out over the substrate, more preferably spread out over substantially the entire substrate. This prevents the formation of specific areas on the substrate that display large differences in performance compared to other areas on the substrate. Put differently, the placement according to an aspect of the present disclosure improves the randomness of placement of the components on the substrate thereby improving uniformity.

The carrier may comprise a foil or film, and/or the plurality of components may comprise semiconductor dies or packaged semiconductor dies arranged on the carrier. Additionally, or alternatively, the plurality of components can be formed by a diced semiconductor wafer arranged on the carrier. Additionally, or alternatively, the plurality of components may comprise light-emitting diodes, either in a base semiconductor die or in a packaged form.

The components can be arranged in a plurality of first rows and first columns of first positions on the carrier at which positions the components are to be collected. Furthermore, the substrate may comprise a plurality of second rows and second columns of second positions on the substrate at which positions the components are to be placed.

For each placement pattern and for at least one direction among a direction corresponding to the second rows and a direction corresponding to the second columns, second positions corresponding to that placement pattern can be separated in said at least one direction by one or more second positions corresponding to one or more of the other placement patterns. For example, the row direction may correspond to an x-direction and the column direction to a y-direction that is perpendicular to the x-direction. Examples of placement patterns are indicated below, wherein the horizontal direction corresponds to the x-direction and the vertical direction to the y-direction.

| | | |
|---|---|---|
| X ○ X ○<br>X ○ X ○<br>X ○ X ○ | X ○ X ○<br>○ X ○ X<br>X ○ X ○ | X X X X<br>○ ○ ○ ○<br>X X X X |

In the examples above, an "X" indicates that at this position a component will be placed on the substrate when processing that placement pattern, and a "0" indicates that at this position a component will not be placed onto the substrate when processing that placement pattern. For the examples above, it can be concluded that by interleaving these placement patterns, a component can be arranged on all available second positions on the substrate.

The respective placement patterns can substantially be translated copies of each other. Here, the wording "substantially" indicates that differences between placement patterns may exist around the edges of the placement patterns.

Each placement pattern may cover substantially the entire substrate. This means that during each pass in which a single placement pattern is processed, components will be spread out over substantially the entire substrate.

The placement patterns are uniform placement patterns. Here, a uniform placement pattern could refer to a pattern in which the distance between adjacent second positions is constant in the row direction and is constant in the column direction.

Each placement pattern comprises a repetition of a unit cell. The unit cell comprises second positions to which that placement pattern corresponds, and empty positions representing second positions to which other placement patterns correspond. The unit cell has a first size in a first direction and a second size in a second direction different from the first direction, for example perpendicular to the first direction. A distance between each pair of unit cells in the first direction then equals an integer times the first size, and a distance between each pair of unit cells in the second direction equals an integer times the second size.

The controller may be configured to, for the purpose of performing one pass, process the unit cells corresponding to the relevant placement pattern on a line-by-line basis, wherein each line comprises a plurality of unit cells that are adjacently arranged in the first direction. A line-by-line basis limits the movements of the target supporting unit thereby enabling a high throughput.

The pick-and-place apparatus can be configured to, for each unit cell, introduce one or more offsets in the second direction when processing a line of unit cells. An example of a unit cell in which offsets are not used is illustrated below:

X X

O O

Here, the first direction corresponds to the left-right direction and the second direction to the top-bottom direction. By applying an offset in the second direction the following unit cell can be obtained:

X O

O X

The controller can be configured to cause the components to be collected from the carrier in a number of passes, wherein during each pass, components among the plurality of components are collected from the carrier in accordance with a respective collect pattern among a collection of interleaved collect patterns.

For each collect pattern and for at least one direction among a direction corresponding to the first rows and a direction corresponding to the first columns, first positions corresponding to that collect pattern can be separated in said at least one direction by one or more first positions corresponding to one or more of the other collect patterns. Because the moveable substrate table is generally relatively heavy, it is preferred to limit the movements of this table to enable a high throughput. To this end, a suitable collect pattern may for example be the regular repetition of the 1×3 unit cell as shown below:

X X X X

O O O O

O O O O

Three passes are required to ensure that all components are collected from the carrier.

The pick-and-place apparatus may comprise a pattern determination unit that is configured to receive a wafer map that indicates the performance and/or characteristics of the components on the carrier that are to be placed on the substrate. The pattern determination unit can be further configured to determine, for each predefined combination of collect and placement patterns among a plurality of said combinations, a value of a uniformity metric that describes the uniformity of the performance and/or characteristics of the components over the substrate if the components are pick-and-placed on the substrate on the basis of that predefined combination, a value of a throughput metric that describes the throughput of the pick-and-place apparatus when using that predefined combination, and a value of a general metric based on a weighed combination of the value of the uniformity metric and the value of the throughput metric.

The pattern determination unit can be further configured to determine an optimal combination of collect and placement patterns among the plurality of combinations using the determined values of the general metric, and to provide the optimal combination of collect and placement patterns to the controller. In this manner, the collect and placement patterns can be optimized for a given wafer map. In scenarios where the wafer map shows similar trends for different wafers, the same combination of collect and placement patterns can be used without involving the pattern determination unit.

Generally, by increasing the number of passes, and/or by increasing the number of placement patterns and/or collect patterns, a better randomness and uniformity can be achieved. However, increasing the number of passes comes at a cost with respect to the throughput of the apparatus. By using the general metric, a trade off can be found. Furthermore, the balance between throughput and uniformity may differ among users and/or applications. This can be accounted for by having variable or adjustable weighing factors.

The transport unit can be configured to collect each component from the carrier at a same collect position in space, and the controller can be configured to, for the purpose of collecting the components from the carrier, control the first drive unit for moving the target supporting unit relative to said collect position in space. Additionally or alternatively, the transport unit can be configured to release each collected component from the carrier at a same release position in space, and the controller can be configured to, for the purpose of releasing the components on the substrate, control the second drive unit for moving the substrate table relative to said release position in space. For example, the source supporting unit can be moved to bring different first positions in alignment and/or close to the collect position. Similarly, the target supporting unit can be moved to bring different second positions in alignment and/or close to the release position.

According to a further aspect, the present disclosure provides a method for collecting components from a carrier that is arranged on a source supporting unit and for placing the collected components on a substrate that is arranged on a target supporting unit, wherein said placing the collected components comprises placing the components on the substrate in a number of passes, wherein during each pass components among the plurality of components are placed on the substrate in a respective placement pattern among a collection of interleaved placement patterns.

The components can be arranged in a plurality of first rows and first columns of first positions on the carrier at which positions the components are to be collected, and the substrate may comprise a plurality of second rows and second columns of second positions on the substrate at which positions the components are to be placed. For each placement pattern and for at least one direction among a direction corresponding to the second rows and a direction corresponding to the second columns, second positions corresponding to that placement pattern can be separated in said at least one direction by one or more second positions corresponding to one or more of the other placement patterns.

BRIEF DESCRIPTION OF DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2:
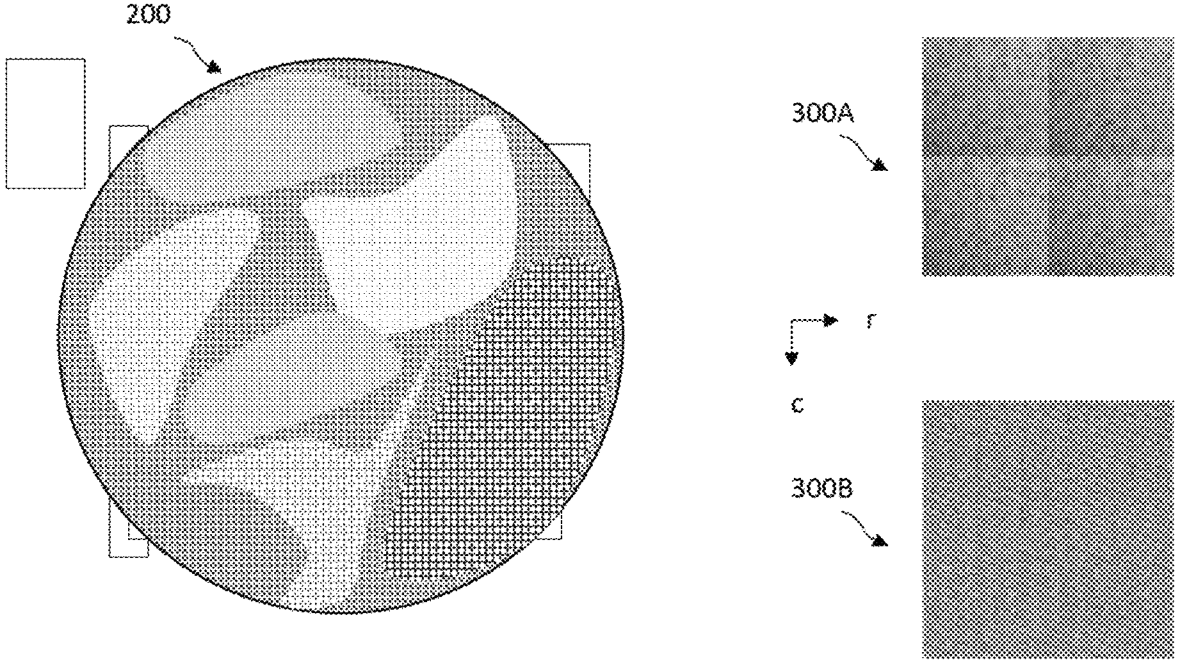
FIG. 2 illustrates a wafer map of a semiconductor wafer and two examples of display panels that can be obtained using semiconductor dies from that semiconductor wafer.

FIG. 2 illustrates an example of a wafer map 200. In this figure, the grey color at a given position indicates a value that is representative for a parameter describing the behavior of the semiconductor die at that position. For example, the grey color could indicate the brightness or color temperature associated with a light-emitting diode at that position.

FIG. 2 further illustrates two examples of display panels 300A, 300B that can be realized using the LEDs from the wafer corresponding to wafer map 200. Display panels 300A, 300B may each comprise a large number, e.g. $10^4$ to $10^6$, of light-emitting diode semiconductor dies.

The figures illustrating display panels 300A, 300B illustrate the color uniformity of the light emitted by display panels 300A, 300B. The difference between display panels 300A, 300B is that display panel 300A has been constructed using a known serpentine-based pick-and-place method and display panel 300B has been constructed using a pick-and-place method in accordance with an aspect of the present disclosure. As can be verified, the uniformity of display panel 300B as perceived by a user is better than that of display panel 300A.

Figure 3:
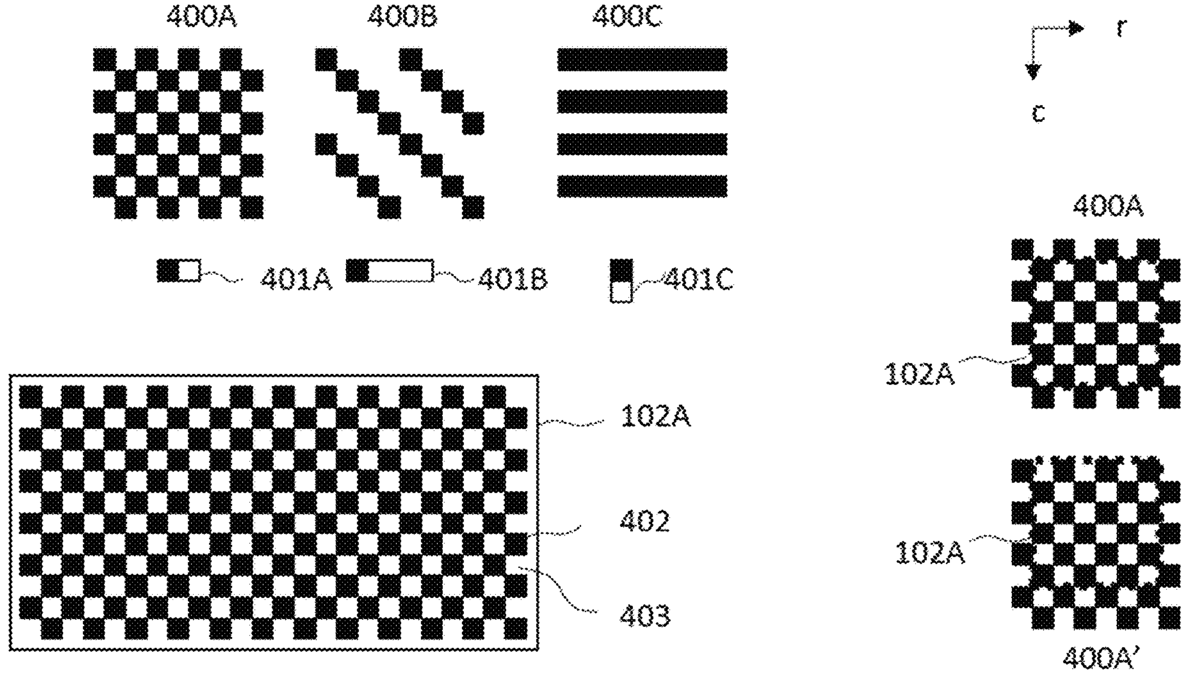
FIG. 3 illustrates four examples of placement patterns with their corresponding unit cells in which offset within unit cells is not used.

FIG. 3 illustrates several examples of placement patterns 400A, 400B, 4000 in accordance with an aspect of the present disclosure. Each placement pattern comprises a regular repetition of a unit cell 401A, 401B, 401C in a row direction r and column direction c. These unit cells are depicted below their respective placement patterns.

Placement patterns 400A, 400B, 4000 are arranged over substrate 102A. An example thereof is shown for placement pattern 400A. For each placement pattern, a black box indicates that during the processing of that placement pattern, i.e. during a single pass, a component is to be arranged on substrate 102A at that position, whereas a white box indicates that no components needs to be arranged at that position. The occupancy level of each unit cell, i.e. the number of black boxes divided by the total number of boxes, determines the number of passes required to completely fill substrate 102A. For example, for unit cell 401B, the occupancy level equals ¼, requiring 4 passes to completely fill substrate 102A. Typically, the number of required passes equals the reciprocal of the occupancy level rounded off to the nearest larger integer.

By interleaving two placement patterns similar to placement pattern 400A, it can be ensured that substrate 102A is entirely filled with components. This is shown on the right in FIG. 3. Here, a first placement pattern 400A is arranged over substrate 102A for arranging components during a first pass. A second placement pattern 400A' is also arranged over substrate 102A for arranging components during a second pass. By consecutively performing the first and second passes, it can be ensured that substrate 102A is entirely filled with components. Furthermore, placement patterns 102A, 102A' represent translated copies of each other.

Placements patterns 400A-4000 can be processed by allowing the target supporting unit to make a serpentine-based motion. For example, the movable target table may start at the upper left corner of substrate 102A and first perform a right-to-left motion. When it reaches the edge on the right of substrate 102A it shifts one row up and performs a left-to-right motion. When it reaches the edge on the left of substrate 102A it shifts up a row and the motions described above can be repeated.

Figure 4:
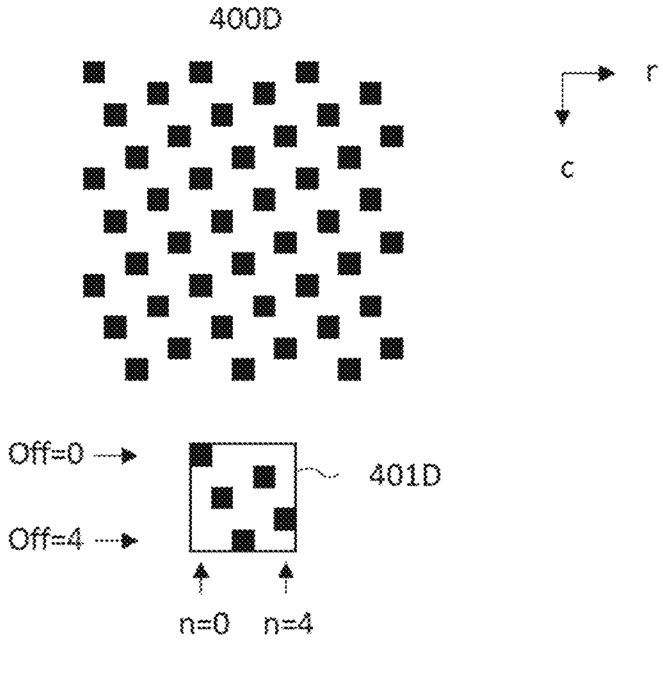
FIG. 4 illustrates an example of a placement pattern with its corresponding unit cell in which offset within the unit cell is used.

FIG. 4 illustrates another example of a placement patterns 400D in accordance with an aspect of the present disclosure. Compared to placement patterns 400A-4000, unit cell 401D is two dimensional instead of a 1 by n configuration. For example, unit cell 401D spans 5 by 5 positions.

Unit cell 401D offers the advantage of improved randomness when using this placement pattern for arranging components on substrate 102A. Such randomness improves the uniformity of the components on substrate 102A.

Unit cell 401D can be obtained by using a column index n as shown in FIG. 4. The offset Off in the column direction to be used for a given column index can be found using:

$$\text{Off} = \text{mod}(n + n \cdot \text{floor}(N/B), N)$$

where N is the number of passes, B a constant, mod (a, b) a function returning the remainder when a is divided by b, and floor (a) rounding off a to its lowest neighboring integer. For example, for unit cell 401D, N=5 and B=5 yields:

$$\text{Off for } n = 0 \text{ equals } \text{mod}(0 + 0 \times \text{floor}(5/5), 1) = 0$$

$$\text{Off for } n = 1 \text{ equals } \text{mod}(1 + 1 \times \text{floor}(5/5), 1) = 2$$

$$\text{Off for } n = 2 \text{ equals } \text{mod}(2 + 2 \times \text{floor}(5/5), 1) = 4$$

$$\text{Off for } n = 3 \text{ equals } \text{mod}(3 + 3 \times \text{floor}(5/5), 1) = 1$$

$$\text{Off for } n = 4 \text{ equals } \text{mod}(4 + 4 \times \text{floor}(5/5), 1) = 3$$

In the discussion above nothing was mentioned about the manner in which components are collected from the carrier. For collecting the components, similar patterns can be used as the placement patterns described above. However, for minimizing the movements of the source supporting unit, it is preferred if this table makes relatively simple movements. For example, the collect patterns can be similar to that of placement pattern 4000. Instead of skipping a single row, multiple rows could be skipped. This would improve the uniformity of the display panel but would result in a decrease in throughput as the source supporting unit would be required to move more.

Figure 1:
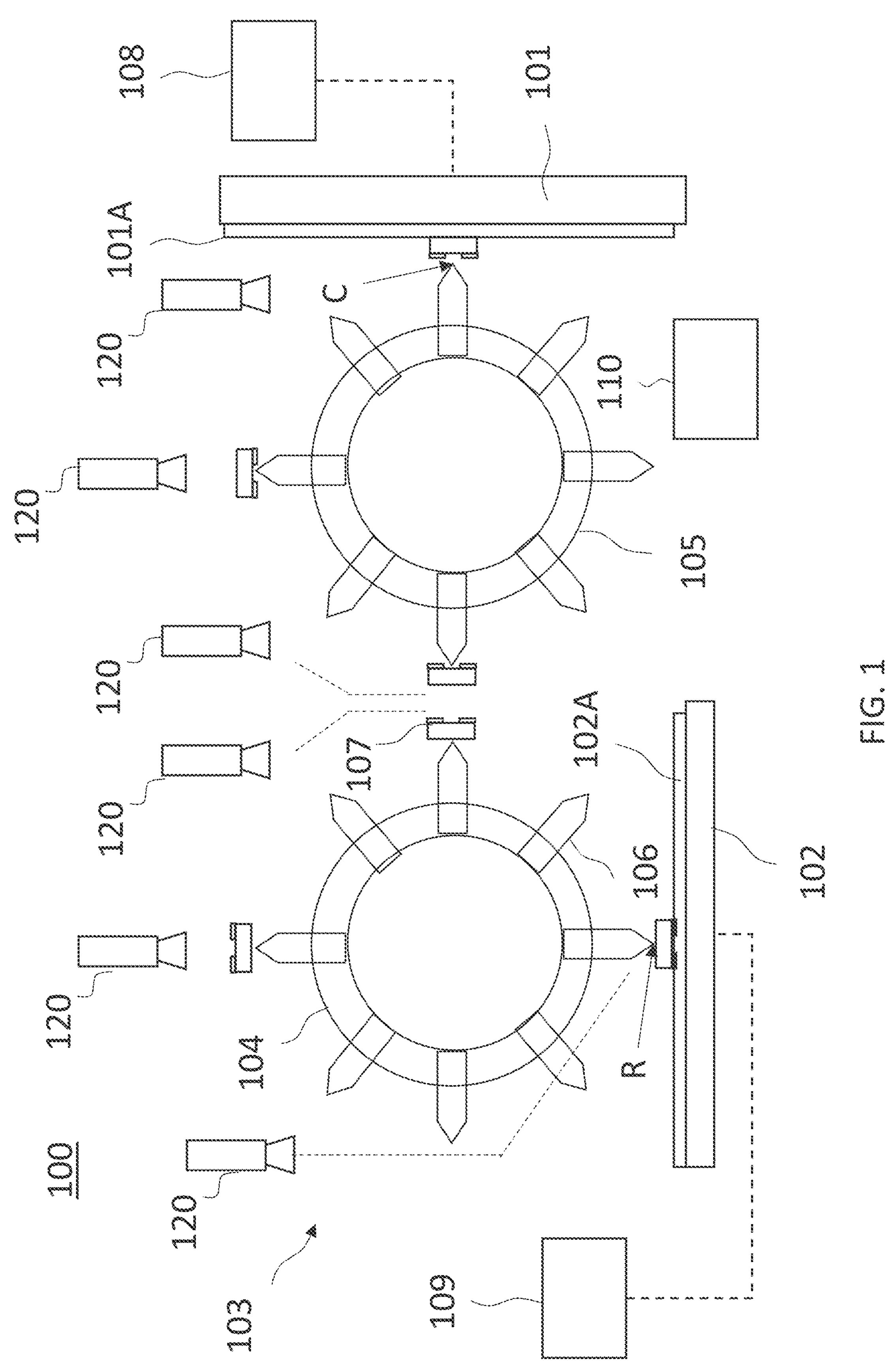
FIG. 1 illustrates a known pick-and-place apparatus.

In an embodiment, the pick-and-place apparatus according to an aspect of the present disclosure is configured as the apparatus in FIG. 1 with the exception that controller 110 is adapted to control first drive unit 108, second drive unit 109, and transport unit 103 to enable the pick-and-place method as described above.

In a further embodiment, the controller may be configured to receive data describing the collect patterns and/or placement patterns to be used during the pick-and-place process. In this embodiment, these patterns are computed and/or determined remote from the pick-and-place apparatus. Alternatively, the controller may be configured to receive user input, for example using a user interface, that describes parameters of the collect and/or placement patterns. Examples of such parameters can be the number of rows to skip when switching between rows during component collect, and/or the number of positions to skip in the row and/or column direction when switching between rows and/or columns, respectively during component placement.

To assist in determining the collect and/or placement patterns, a uniformity metric may be used. This metric describes the uniformity of one or more parameters, such as brightness or the color of LEDs, describing the performance of the components over the substrate. Such metric should be indicative of how much a local average parameter value deviates from the average value of that parameter over the entire substrate, i.e. the so-called global average value. For example, the local average parameter value for a given position on the substrate can be determined by determining the average of the parameter value at that position and the parameter values of the nearest neighbors at that position. This process is illustrated in FIG. 5.

Figure 5:
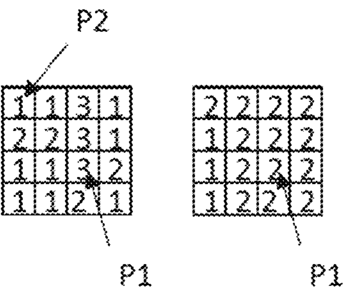
FIG. 5 illustrates the computation of a local average for a given wafer map.

For example, in FIG. 5, the local average value for position P1 can be computed using (2+3+1+1+3+2+1+2+1)/9=16/9, which in FIG. 5 is rounded off to the nearest integer 2. At the edges, where the number of nearest neighbors is less than 8, substitute values may be used. For example, for position P2 the local average value can be computed using (Av+Av+Av+Av+1+1+Av+2+2)/9, wherein Av is the global average value of the parameter. Instead of using substitute values, the window may be reduced taking only into account the positions for which a value is known. For example, the local average value for the upper left corner can be computed using (1+1+2+2)/4=6/4, which in FIG. 5 is rounded off to the nearest integer 2 as shown on the right.

Having computed a local average value at each position, it can be compared to the global average value. For example, a metric can be defined as the ratio between the global average value and the standard deviation of the collection of local average values. In this case, the value of the metric is high when the standard deviation is low.

The abovementioned metric is a uniformity metric describing uniformity over the substrate. This metric depends on the collect and placement patterns that are used during the pick-and-place process and the wafer map. The throughput of the pick-and-place apparatus is also determined by these patterns. For example, the more passes are required to fill a substrate, the lower the throughput will be. In addition, more complex patterns, such as that shown in FIG. 4, require more movement of the target supporting unit than less complex patterns such as those shown in FIG. 3.

A throughput metric can be used that for example corresponds to a time required for completely filling a substrate or to a number of substrates that can be filled in a certain time interval. Using the uniformity metric and throughput metric, a general metric can be constructed that describes the trade off between uniformity over the substrate and the throughput. For example, assuming that the throughput metric Mt describes the number of substrates filled within a certain time interval, a general metric Mg can be computed using Mg=w1×Mu+w2×Mt, wherein Mu is the uniformity metric, and w1 and w2 are weighing constants.

The throughput metric, uniformity metric, and general metric can be computed for each combination of collect and placement patterns. In an embodiment, the metrics are determined for a given collection of different combinations of patterns. This allows the best combination to be selected for a given wafer map.

Controller 110 may be configured to automatically determine the best combination. To that end, it may comprise a pattern determination unit that takes the wafer map and determines the general metric for each combination of collect and placement patterns among a predefined collection of such combinations. Having determined the best combination, it uses the associated collect and placement patterns for the pick-and-place process. It should be noted that instead of using a pattern determination unit that is part of and/or embodied by controller 110 for performing these calculations, an external device could equally be used of which the output is fed to controller 110, either manually or automatically.

Particular and preferred aspects of the disclosure are set out in the accompanying independent claims. Combinations of features from the dependent and/or independent claims may be combined as appropriate and not merely as set out in the claims.

For example, FIG. 1 illustrates a particular transport unit. Embodiments of the present disclosure may however include a different type of transport unit that collects a component from the carrier and places the collected component on the substrate.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term “comprising” does not exclude other elements or steps, the term “a” or “an” does not exclude a plurality. Reference signs in the claims shall not be construed as limiting the scope of the claims.

What is claimed is:

1. A pick-and-place apparatus, comprising:

a pick-and-place apparatus, comprising: a source supporting unit, that is a moveable source table, configured to hold a carrier that is provided with and/or supports a plurality of components;

a target supporting unit, that is a moveable target table, configured to hold a substrate;

a first drive unit for driving the source supporting unit;
a second drive unit for driving the target supporting unit;
a transport unit for collecting a component from the carrier and for placing the collected component on the substrate;
and a controller for controlling the first drive unit, the second drive unit, and
the transport unit; and
a pattern determination unit that is configured to:
receive a wafer map that indicates the performance and/or characteristics of the components on the carrier that are to be placed on the substrate;
determine, for each combination of interleaved collect patterns and/or interleaved placement patterns among a plurality of the combinations:
a value of a uniformity metric that describes the uniformity of the performance and/or characteristics over the substrate if the components are pick-and-placed on the substrate on the basis of each predefined combination;
a value of a throughput metric that describes the throughput of the pick-and-place apparatus when using the predefined combination;
a value of a general metric based on a weighed combination of the value of the uniformity metric and the value of the throughput metric; determine an optimal combination of interleaved collect patterns and interleaved placement patterns among the plurality of combinations using the determined values of the general metric; and
provide the optimal combination of interleaved collect patterns and/or interleaved placement patterns to the controller;
wherein the controller is configured to:
cause the components to be collected from the carrier in a number of passes, wherein during each pass, components among the plurality of components are collected from the carrier in accordance with a respective collect pattern among the optimal combination of interleaved collect patterns; and/or
cause the components to be placed on the substrate in a number of passes, wherein during each pass components among the plurality of components are placed on the substrate in a respective placement pattern among the optimal combination of interleaved placement patterns.

2. The pick-and-place apparatus according to claim 1, wherein the carrier comprises a foil or film, and/or wherein the plurality of components comprises semiconductor dies or packaged semiconductor dies arranged on the carrier, and/or wherein the plurality of components is formed by a diced semiconductor wafer arranged on the carrier, and/or wherein the plurality of components comprises light-emitting diodes.

3. The pick-and-place apparatus according to claim 1, wherein the components are arranged in a plurality of first rows and first columns of first positions on the carrier at which positions the components are to be collected, and wherein the substrate comprises a plurality of second rows and second columns of second positions on the substrate at which positions the components are to be placed.

4. The pick-and-place apparatus according to claim 3, wherein for each placement pattern and for at least one direction among a direction corresponding to the second rows and a direction corresponding to the second columns, second positions corresponding to that placement pattern are separated in the at least one direction by one or more second positions corresponding to one or more of the other placement patterns.

5. The pick-and-place apparatus according to claim 1, wherein the respective placement patterns substantially are translated copies of each other.

6. The pick-and-place apparatus according to claim 1, wherein each placement pattern covers substantially the entire substrate.

7. The pick-and-place apparatus according to claim 1, wherein the placement patterns are uniform placement patterns.

8. The pick-and-place apparatus according to claim 7, wherein each placement pattern comprises a repetition of a unit cell, the unit cell comprising second positions to which that placement pattern corresponds, and empty positions representing second positions to which other placement patterns correspond, the unit cell having a first size in a first direction and a second size in a second direction different from the first direction, wherein each pair of unit cells has a distance between each pair that in the first direction equals an integer times the first size, and wherein each pair of unit cells has a distance between each pair that in the second direction equals an integer times the second size.

9. The pick-and-place apparatus according to claim 8, wherein the controller is configured to perform one pass, by processing the unit cells corresponding to the relevant placement pattern on a line-by-line basis, wherein each line comprises a plurality of unit cells that are adjacently arranged in the first direction; and wherein the pick-and-place apparatus is configured to, for each unit cell, introduce one or more offsets in the second direction when processing a line of unit cells.

10. The pick-and-place apparatus according to claim 3, wherein for each collect pattern and for at least one direction among a direction corresponding to the first rows and a direction corresponding to the first columns, first positions corresponding to that collect pattern are separated in the at least one direction by one or more first positions corresponding to one or more of the other collect patterns.

11. The pick-and-place apparatus according to claim 1, wherein the pattern determination unit is comprised of and/or embodied by the controller.

12. The pick-and-place system according to claim 1, wherein the transport unit is configured to collect each component from the carrier at a same collect position in space, and wherein the controller is configured to, collect the components from the carrier, by controlling the first drive unit for moving the source supporting unit relative to the collect position in space; and/or wherein the transport unit is configured to release each collected component on the substrate carrier at a same release position in space, and wherein the controller is configured to release the components on the substrate, by controlling the second drive unit for moving the moveable substrate table relative to the release position in space.

13. A pick-and-place system, comprising:
a pick-and-place apparatus, comprising:
a source supporting unit, that is a moveable source table, configured to hold a carrier that is provided with and/or supports a plurality of components;
a target supporting unit, that is a moveable target table, configured to hold a substrate;
a first drive unit for driving the source supporting unit; a second drive unit for driving the target supporting unit;

a transport unit for collecting a component from the carrier and for placing the collected component on the substrate; and a controller for controlling the first drive unit, the second drive unit, and the transport unit, wherein the controller is configured to receive data describing collect patterns and/or placement patterns to be used during the pick-and-place process; and a pattern determination unit that is configured to: receive a wafer map that indicates the performance and/or characteristics of the components on the carrier that are to be placed on the substrate;

determine, for each combination of interleaved collect patterns and/or interleaved placement patterns among a plurality of the combinations:

a value of a uniformity metric that describes the uniformity of the performance and/or characteristics over the substrate if the components are pick-and-placed on the substrate on the basis of each predefined combination;

a value of a throughput metric that describes the throughput of the pick-and-place apparatus when using the predefined combination; a value of a general metric based on a weighed combination of the value of the uniformity metric and the value of the throughput metric; determine an optimal combination of interleaved collect pattern and interleaved placement patterns among the plurality of combinations using the determined values of the general metric;

and provide the optimal combination of interleaved collect patterns and/or interleaved placement patterns to the controller; wherein the controller is configured to: cause the components to be collected from the carrier in a number of passes, wherein during each pass, components among the plurality of components are collected from the carrier in accordance with a respective collect pattern among the optimal combination of interleaved collect patterns;

and/or cause the components to be placed on the substrate in a number of passes, wherein during each pass components among the plurality of components are placed on the substrate in a respective placement pattern among the optimal combination of interleaved placement patterns.

14. A method for collecting components from a carrier that is arranged on a source supporting unit and for placing the collected components on a substrate that is arranged on a target supporting unit, the method comprising:

receiving a wafer map that indicates the performance and/or characteristics of the components on the carrier that are to be placed on the substrate;

determining, for each combination of interleaved collect patterns and interleaved placement patterns among a plurality of the combinations:

a value of a uniformity metric that describes the uniformity of the performance and/or characteristics over the substrate if the components are pick-and-placed on the substrate on the basis of each predefined combination; a value of a throughput metric that describes the throughput of a pick-and-place apparatus when using the predefined combination;

a value of a general metric based on a weighed combination of the value of the uniformity metric and the value of the throughput metric;

determining an optimal combination of collect and placement patterns among the plurality of combination using the determined values of the general metric;

collecting the components from the carrier in a number of passes, wherein during each pass, components among the plurality of components are collected from the carrier in accordance with a respective collect pattern among the optimal combination of interleaved collect patterns; and/or placing the components on the substrate in a number of passes, wherein during each pass components among the plurality of components are placed on the substrate in a respective placement pattern among the optimal combination of interleaved placement patterns.

15. The method according to claim 14, wherein the components are arranged in a plurality of first rows and first columns of first positions on the carrier at which positions the components are to be collected, wherein the substrate comprises a plurality of second rows and second columns of second positions on the substrate at which positions the components are to be placed, and wherein for each placement pattern and for at least one direction among a direction corresponding to the second rows and a direction corresponding to the second columns, second positions corresponding to that placement pattern are separated in the at least one direction by one or more second positions corresponding to one or more of the other placement patterns.

* * * * *